United States Patent
Hezel et al.

(10) Patent No.: US 6,172,297 B1
(45) Date of Patent: Jan. 9, 2001

(54) SOLAR CELL AND METHOD FOR FABRICATION OF A SOLAR CELL

(75) Inventors: Rudolf Hezel; Axel Metz, both of Hameln (DE)

(73) Assignee: Institut fur Solarenergieforschung GmbH, Emmerthal (DE)

(*) Notice: Under 35 U.S.C. 154(b), the term of this patent shall be extended for 0 days.

(21) Appl. No.: 09/282,199

(22) Filed: Mar. 31, 1999

(51) Int. Cl.⁷ ............................................. H01L 31/0236
(52) U.S. Cl. .................... 136/256; 136/255; 438/29; 438/42; 438/71; 204/192.26
(58) Field of Search .................. 438/29, 38, 42, 438/43, 71, 98; 136/244, 249, 252, 255, 256; 204/192.29, 192.26

(56) References Cited

U.S. PATENT DOCUMENTS

| | | | |
|---|---|---|---|
| 4,239,810 | 12/1980 | Alameddine et al. | |
| 4,278,473 | * 7/1981 | Borden | 136/249 |
| 4,322,571 | * 3/1982 | Stanbery | 136/255 |
| 4,352,948 | * 10/1982 | Kaplow et al. | 136/249 |
| 4,379,944 | * 4/1983 | Borden et al. | 136/259 |
| 4,427,839 | * 1/1984 | Hall | 136/255 |
| 4,444,992 | 4/1984 | Cox, III. | |
| 4,453,030 | * 6/1984 | David et al. | 136/256 |
| 4,570,173 | * 2/1986 | Anthony et al. | 357/20 |
| 4,608,451 | * 8/1986 | Landis | 136/256 |
| 4,626,613 | * 12/1986 | Wenham et al. | 136/255 |
| 4,886,555 | * 12/1989 | Hackstein et al. | 136/255 |
| 5,053,083 | * 10/1991 | Sinton | 136/256 |
| 5,258,077 | * 11/1993 | Shahryar | 136/256 |
| 5,356,488 | * 10/1994 | Hezel | 136/255 |
| 5,449,626 | 9/1995 | Hezel. | |
| 5,580,395 | * 12/1996 | Yoshioka et al. | 136/255 |
| 5,704,992 | 1/1998 | Willeke et al. | |
| 5,853,497 | * 12/1998 | Lillington et al. | 136/249 |

FOREIGN PATENT DOCUMENTS

| | | |
|---|---|---|
| 4033658 | 4/1992 | (DE). |
| 0334330 | 9/1989 | (EP). |
| 0561615 | 9/1993 | (EP). |

OTHER PUBLICATIONS

R. Hezel and A. Metz; "A New Strategy for the Fabrication of Cost–Effective Silicon Solar Cells"—*Renewable Energy*, vol. 14, Nos. 1–4, pp. 83–88, May 8, 1998.

"A Closed–Form Two–Dimensional Model of a Laser Grooved Solar Cell". Antonio G. M. Strollo and Gianfranco Vitale. Solid–State Electronics, vol. 35, No. 8, 1992, pp. 1109–1118.

"Polycrystalline Silicon Solar Cells with a Mechanically Formed Texturization". H. Bender et al. Appl. Phys. Lett. 62 (23), Jun. 7, 1993, pp. 2941–2943.

Reactive Ion Etheing (RIE) as a Method for Texturing Polycrystalline Silicon Solar Cells. S. Winderbaum et al. Solar Energy Materials and Solar Cells 46, 1997, pp. 239–248.

"Aktuelle PV–Tendenzen", 6. Jahrestagung des Forschungsverbundes Sonnenergie. von M. Huttman. Sonnenergie May 1995, pp. 14–15.

\* cited by examiner

*Primary Examiner*—Ellis Robinson
*Assistant Examiner*—Michael C. Miggins
(74) *Attorney, Agent, or Firm*—Dennison, Scheiner, Schultz & Wakeman

(57) ABSTRACT

A solar cell (1) is proposed, which is having at least at one side a semiconductor surface (2), on which edges (3) are formed having flank-like regions (4) running substantially parallel to the substrate normal and on which the electrical conductive contacts (5) are arranged. To be able to produce solar cells using simple technology with high cell efficiencies the electrical conductive material is deposited to the flank-like regions as well as to some none flank-like areas (6). The electrical conductive material is removed mask-free and selectively from the none flank-like areas resulting in electrical conducting contacts remaining on the flank-like regions only.

16 Claims, 5 Drawing Sheets

SOLAR CELL AND METHOD FOR FABRICATION OF A SOLAR CELL

BACKGROUND OF THE INVENTION

Figure 1:
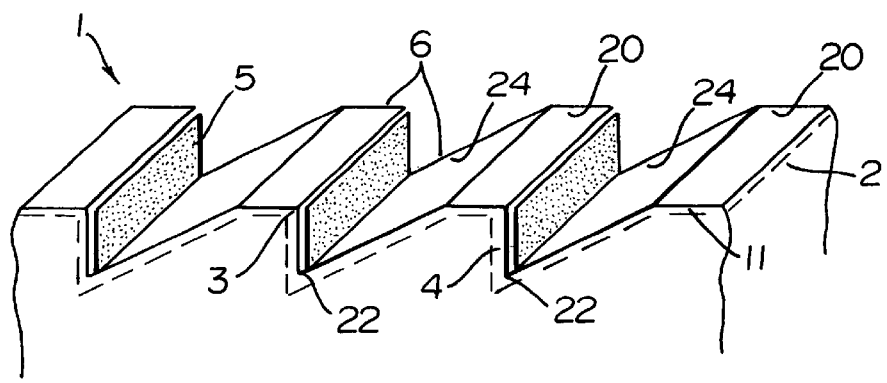

The invention relates to a solar cell, comprising of a semiconducting material in which the incident radiation energy can generate charge carriers. The charge carriers are separable by an electric field and then conductible by first and second electrically conductive contacts. Whereas at least on one surface of the semiconductor groove-like depressions are formed, with at least one flank-like area and of which at least one of said flank-like areas carries directly or indirectly electrical conductive material, used for the formation of said first electric contact. Furthermore the invention relates to the method for the fabrication of a solar cell comprising a semiconductor material in which due to the incident radiation energy charge carriers can be generated, which are separatable by an electric field and carried then conductible by first and second conductive contacts, where on one side of the semiconductor surface groove-like depressions are formed, with flank-like areas to which electrical conductive material for the formation of the electrical conductive contacts is applied.

For industrial manufacturing of the metal contacts of conventional solar cells screen printing is the most common method. This method works by pressing a metal consisting paste through a stencil like screen onto the desired location of the solar cell surface. Upon that process the paste will be sintered by elevated temperatures between 700° C. and 800° C. This removes the solvents from the paste and gains a good electrical conductive and mechanical stable contact to the silicon surface. The main advantage of this method is the simplicity and the therefore resulting low production costs. But this method has a number of disadvantages. Limited by the manufacturing method, the width of screen printed contact lines is typically not smaller than 100 $\mu$m. From this width a relatively high percentage (12%) of light shadowing results. This high shadowing requires a large contact line distance of at least 3 mm. This requires again a highly diffused emitter, to keep the resistance losses at an acceptable level. Another difficulty of the screen printed solar cells is the relatively high contact resistance of the metal-semiconductor-contact. It is necessary to produce a high surface concentration of doping atoms to gain a low contact resistance between the semiconductor and the metal grid. This requirement of a highly diffused emitter with a high surface doping concentration results in a bad sensitivity in the ultraviolet spectral region of sun light. This can be explained by the fact that ultraviolet light is absorbed very close to the surface of the solar cell, and so electrons and holes are generated close to the surface. Because of the high doping level in this region of the cell recombination takes place very fast and therefore ultraviolet light does not contribute to the current produced in the solar cell.

One way to reduce the above mentioned problems of screen printed solar cells is the Buried Contact Solar Cell (BCSC) (U.S. Pat. No. 4,726,650). This type of cell has narrow and deep grooves (width:depth 1:2–1:7) at the surface which dictate the positions and the shape of the metallization. The metallization is generated by the method of electroless deposition. During this deposition the metal fills the grooves totally or nearly totally. By generating very narrow grooves (20–50 $\mu$m) the shadowing could be reduced compared to screen printed solar cells, but this method also has a number of disadvantages. To employ the seemingly simple method of electroless deposition, a number of very high energy consuming process steps are necessary. In addition to the elevated temperature process step of the emitter diffusion at around 850° C., at least two other high temperature processes are needed (every step requires several hours at around 1000° C.) (C. B. Honsberg et al.; Conf. Rec. 24th IEEE Photovoltaic Specialists Conference, Hawaii, 1994, P. 1473–1476). The first of these two additional high temperature steps will create a diffusion barrier. This barrier consists of a thick thermal oxide for the subsequent deep diffusion in the grooves. The second step consists of the deep diffusion in the grooves itself. This mainly serves the reduction of corrosion between the deposited metal fingers normally consisting of nickel, copper and silver. The corrosion would produce current shunts in the solar cell. The metallization step requires also a large number of different galvanic bathes and produces environmentally critical waste. In addition this type of metallization produces a large contact surface between the metal and the semiconductor due to the shape of the grooves. This relatively large contact area reduces the open circuit voltage of the cell and therefore the efficiency.

It is commonly known that vacuum evaporated contacts have the best contact properties compared to the above mentioned methods. The method of shallow angle evaporation (Borden et al Proc. 16th IEEE Photovoltaic Specialists Conf., San Diego, 1982, P. 574 ff, and Hezel Proc. 13th European Photovoltaic Solar Energy Conf., Nice, 1995, S. 115–118).) is a promising possibility for the manufacturing of metal contacts. For this method closely running parallel grooves have to be produced on the solar cell surface, which normally have a half circle or v-shaped cross section. These narrow elevations are employed as shadow edges for the subsequent evaporation of the metal contact material under a shallow angle to the substrate surface. The common disadvantages of the perpendicular shadow mask evaporation are eliminated with the help of the shallow angle evaporation. Due to the self aligning elevations the use of shadow masks for definition of the front contacts can be avoided and the machine capacity can be enormously increased compared to conventional evaporation method. This is due to the possibility of spacing of the wafers very closely in the evaporation chamber, because of the very shallow angle of the wafers to the evaporation source (Hezel, Proc. 13th European Photovoltaic Solar Energy Conf.; Nice, 1995, P. 115). In addition, the use of the evaporated material is much higher using this method compared to the shadow mask evaporation. Using the conventional method, the evaporation material is deposited mainly onto the shadow masks and afterwards has to be removed from the masks employing work intensive etching steps. The introduced method allows for a variation of metallization finger width simply by changing the evaporation angle, since the groove width is normally dictated by the used fabrication tool (e.g. diamond dicing blade, wire and slurry). The distance of the contact fingers is also given by the fabrication tool. Cells of this type are achieving currently efficiencies of 18.6% (Verbeek et al., Proc. 25tz IEEE Photovoltaik Specialists Conf., Washington D.C., 1996, P. 521). A sharp shadow of the elevations can only be achieved up to a distance of 500 $\mu$m. This is due to divergence of the material beam caused by the scattering of the material at the shadow edges, the dimension of the evaporation source and the pressure in the evaporation chamber. The maximum finger distance of this cell type is therefore limited to less than 500 $\mu$m. Besides which using v-shaped grooves the light shadowing is relatively high since the fingers are at a angle of 35° to the substrate basis. Another point is the relatively high amount of silicon which has to be removed from the cell, since the grooves are closely spaced. The last point increases the wear of the tooling and the manufacturing costs.

In EP 0 561 615 A2 a circuit of separate IR detectors in an advantageous closely spaced manner and compact arrangement is described. Single elements can be connected by vertical running conductors to the surface of the electrical elements. This is a method which is commonly used for connecting single solar cells to solar cell modules. It is not required that the necessary electrical connecting element runs over the whole length of the corresponding area of the electrical element.

In U.S. Pat. No. 4,379,944, a solar cell is described which has v-shaped grooves extending on the surface of the cell. At one flank of the grooves there is electrical conductive material which is used as the first electrical conductive contact. To achieve a minimum of light shadowing for the solar cell the cell is aligned corresponding to the incident radiation. The distance of the v-shaped grooves is given (in very narrow limits) by the orientation and the thickness of the substrates. The distance of the grooves can have a maximum of 2.7 times the groove depth.

SUMMARY OF THE INVENTION

The described invention has the main intention to improve the solar cell and the process for the fabrication of a solar cell of the described type using only simple technologies and if needed using large scale methods for the simple and cost effective manufacturing of these cells. The applicability should be possible for all types of semiconductors, elementary and compound semiconductors in mono crystalline shape of any surface orientation, in polycrystalline shape of any grain size and orientation as well as in amorphous condition, self supporting or as thin film semiconductor on top of a foreign substrate. Furthermore a high variability should be possible in terms of the formation of the electrical contacts conducting the charge carriers. There should be no dependencies upon the crystalline orientation. Independently there should be a minimal light shadowing of the semiconductor. In addition an optimal gathering of the incident radiation should be achieved.

This invention resolves the problem concerning a solar cell of the above mentioned type. The flank like areas of the solar cell in this invention are vertical or nearly vertical in relation to the surface of the semiconductor surface. One of the electrical conductive contacts is formed only by electrical conductive material at the flank like areas of the solar cell. Further details are given in the subclaims.

In addition the problems of the method of the above mentioned type is mainly resolved by the described vertical flanks and the fact that the electrical conductive material is removed selectively and mask-free from flank like areas, which are outside of the flank like areas. Further details are given in the subclaims.

The electrical conductive contact forming material is deposited onto the flanks of the elevated areas without using a mask using the method of shallow angle vacuum evaporation.

The invention avoids complicated and work intensive mask technologies, by the self alignment of a coherent contact finger system with very little shadowing of the light sensitive solar cell surface while still achieving large conductive finger cross sections. This is possible since the electrical conductive contacts according to the described invention exclusively extend on parallel to substrate normal arranged flank like areas.

It is another main property of the invention to produce the surface structure necessary the for the shallow angle evaporation to achieve a small shadowing of the light sensitive solar cell surface and having large conductive contact cross sections and at the same time keeping the necessary removal of material at a minimum. Among other things this leads to the described drawings and implementation examples of the preferable structures.

The basic idea of the invention described above consists of taking advantage of the columnar growth of angle evaporated metal layers. At a decreasing evaporation angle, the columnar growth makes the evaporated metal layer increasingly porous. The high porosity of shallow angle evaporated material increases the etching rate of the material drastically under the same etching conditions, refer to FIG. 5. This effect makes it possible to take further advantage of the above mentioned surface structures since the metal which is deposited at the not flank like areas can be etched easily. Consequently the thickness of the metal contacts does not need to be dimensioned larger to account for the losses of material due to the etching process.

Figure 4A:
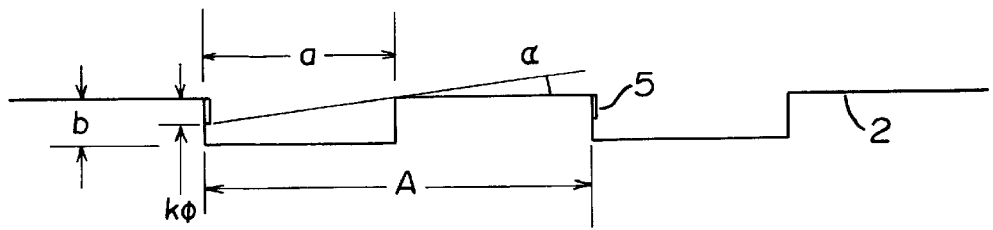
Figure 4B:
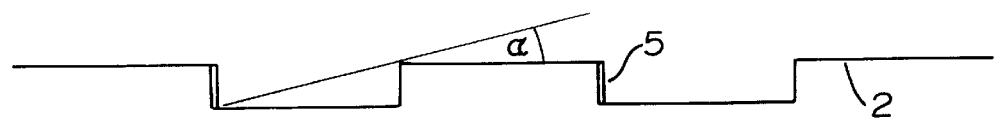
Figure 4C:
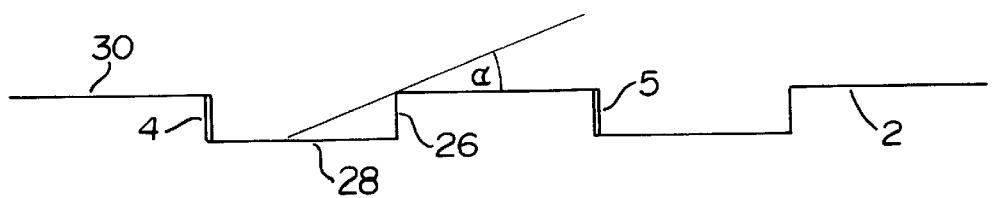

Using this invention it is also possible to vary the finger width not only by the evaporation angle $\alpha$ and the fabrication tool used but also totally independent from these parameters deviating from the currently used and above discussed technology. This can be done by changing the sawing depth or finger width b, assuming the tangent of the evaporation angle $\alpha$ is always larger than the relation of the flank width b to the distance between the shadow edge and the flank a, refer to FIGS. 4a–c. This fact makes the alignment of the evaporation angle less critical since the contact width k is given by the flank width b.

A very important feature of the inventive idea is the possibility of creating generally applicable surface structures which can have any finger distance, deviating from the above discussed current technologies. This is of advantage for some solar cell types, as a smaller number of contact fingers will decrease the light shadowing and therefore the short circuit current increases and at the same time the metal-semiconductor-contact area reduces which will increase the open circuit voltage of the cell caused by the reduced recombination at the metal contacts.

Furthermore there is an advantage over the BCSC which results from the less demanding machine tool use and the reduced wear. The BCSC method requires narrow and deep grooves (width:depth 1:2–1:7) which put a higher strain onto the tooling compared to the relatively wide and shallow grooves (width:depth 1:1–1:10) which are used in this invention. Using shallow grooves gives the possibility to apply this innovative technique to relatively thin substrates and to produce the advantageous surface structure. In addition, the light shadowing is not limited to the smallest producible groove width but can be varied freely with the evaporation layer thickness. This is very advantageous for solar cells having a small finger distance like e.g. MIS solar cells.

It is a part of this invention, deviating from currently used techniques, to produce solar cells with much smaller structures e.g. grooves, slots or pyramids to improve the light gathering of the solar cell. Therefore the two parameters (light gathering and contact distance) can be optimised independently from each other. Up until now solar cells produced with the shallow angle evaporation method used the surface structuring as well for the contact formation as for the improvement of the light gathering. Since the optimum dimension of structures for the best light gathering are in principle one order of magnitude smaller then the structures used for the contact formation, the combination of both in one surface structure results in a reduced cell efficiency. This disadvantage can be eliminated by the surface structure produced with this invention, which is only used for the formation of the electrical conductive contacts. Independently from this structure, a light trapping substructure can be additionally applied for improving the light trapping property of the cell.

Another aim of the invention is to form one or more additional grooves, especially in the lower regions between two electrical contacts, which due to their depth and the pn junction—which extends deep into the semiconductor bulk—improve the collection of the minority carriers in the bulk. The geometric form of the grooves can be of any shape, but choosing a special shape can improve light trapping. Preferably these grooves are formed in conjunction with the contact grooves.

BRIEF DESCRIPTION THE DRAWINGS

Further details, advantages and properties of this invention derive from the following description of a preferred implementation example shown in the figures, as follows.

FIG. 1 arrangement of the contacts on a structured surface of a solar cell

Figure 1A:
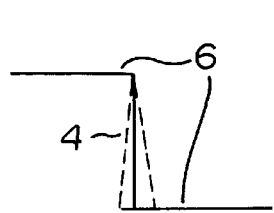
Figure 1B:
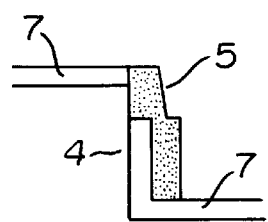
Figure 1C:
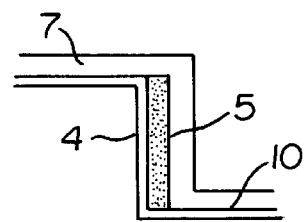
Figure 1D:
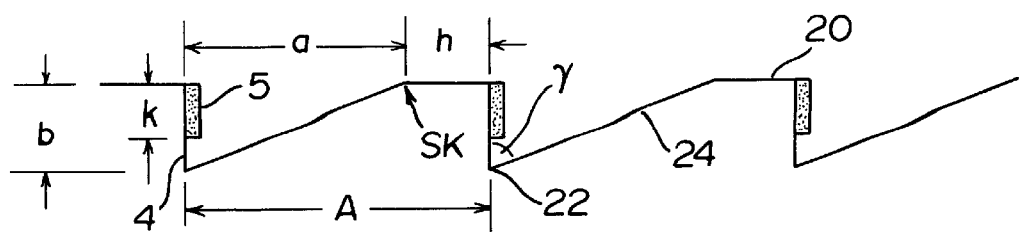
Figure 2A:
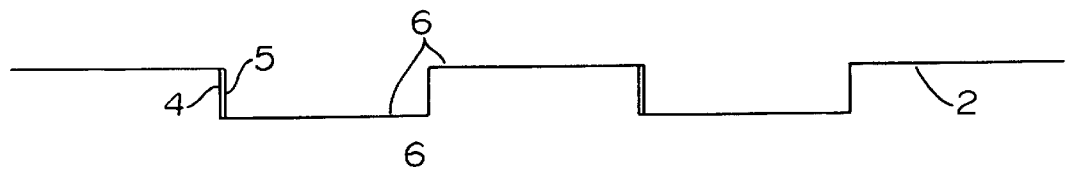
Figure 2B:
Figure 2C:
Figure 3A:
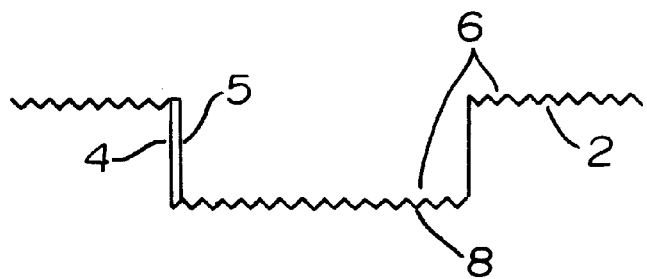
Figure 3B:
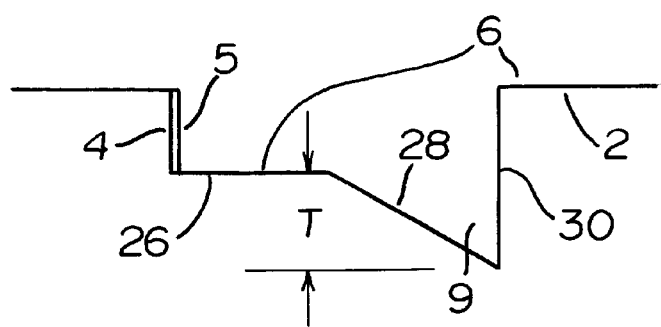
Figure 5:
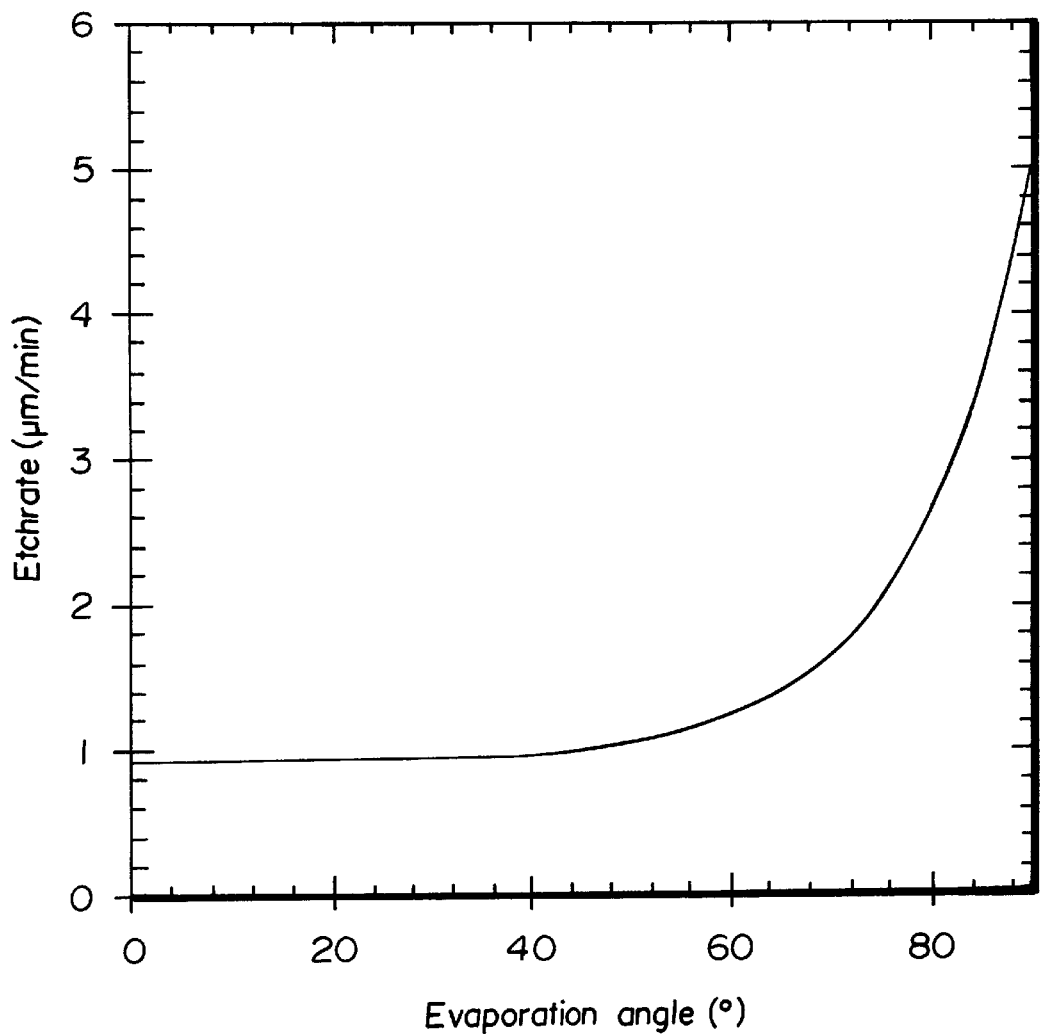

FIG. 1a detail of FIG. 1 with the flank like regions shaped in three different ways FIG. 1b detail of FIG. 1 with partially passivated flank FIG. 1c detail of FIG. 1 with metal-insulator-semiconductor contact FIG. 1d arrangement of the contacts according to FIG. 1 with explanations FIG. 2 Different arranging of the surface structure of the solar cells according to the invention FIG. 3a surface structure with an additionally embossed structure for improved light gathering facilities in the solar cell FIG. 3b surface structure with an additional structure for improved collection of the minority carriers in the solar cell FIG. 4 principle of shallow angle evaporation with different angles a) tan $\alpha<b/a$, b) tan $\alpha=b/a$, c) tan $\alpha>b/a$ on a structured surface and the resulting electrical conducting contacts introduced in this invention FIG. 5 etching rate of aluminium as a function of evaporation angle

DESCRIPTION OF THE PREFERRED EMBODIMENTS

The invention can be put into practice with every solar cell in principle, but they are only described for cells with a doping-induced pn junction. As far as possible, the same reference symbols are used for the same elements.

FIG. 1 shows a schematic of a section of a solar cell (1) with at least one semiconductor surface (2) with formed edges (3), to which flank-like regions (4) adjoin and electrical contacts (5) are directly or indirectly applied. The edges and flank-like regions can be formed using mechanical elements (e.g. diamond tools, cutting wires with slurry) or laser structuring. The metallization can be performed by vacuum evaporation using a small angle to the substrate surface.

The production process of the solar cell shown in FIG. 1 is very simple. In the following paragraphs, an example of a processing sequence for the production of a pn junction solar cell according to the invention is described in detail. In principle, the production process consists of the following eight processing steps:

1) formation of the flank-like regions on the surface of the solar cell
2) cleaning step
3) formation of the pn junction by diffusion of a foreign substance
4) formation of the back contact and sintering
5) formation of the front contacts with shallow angle evaporation
6) etching of the surplus metal from the not-flank-like regions
7) formation of the bus bar
8) formation of an anti-reflection coating The process takes place in the following manner: After the formation of the parallel-running edges (3) and their flank like regions (4) using for example a diamond dicing saw, a thin layer which is damaged by the saw is removed by etching, as due to crystal defects and impurities this layer would increase the surface recombination and hence reduce the efficiency of the solar cell. This step is usually followed by a wet chemical cleaning step to remove organic and metallic impurities from the solar cell surface. The next step is to form a diffusion barrier on the back side of the solar cell, using e.g. PECVD silicon nitride. Due to this barrier, the following diffusion of suitable foreign atoms (e.g. phosphorus atoms on p-type substrate) will result in a pn junction only on the front side of the cell. After the diffusion step, the diffusion barrier is removed from the back side by etching in hydrofluoric acid. Afterwards the metallic back contact is formed using evaporation or screen printing processes and sintered afterwards. In the following step, the front contact is formed. This is done e.g. by physical vacuum evaporation of a metal layer under a shallow angle with the substrate surface, followed by wet chemical mask free and selective etching of the surplus metal from all regions which are not flank-like (6) using an etching solution which is well-suited and well-known for the corresponding metal (e.g. $NH_4$, HCl or Aluminium etching solution). Finally the strip conductors are linked together by applying an electrical conducting connection (busbar) on the cell, and the solar cell is covered with an antireflection coating, using e.g. PECVD silicon nitride.

As an alternative to diamond-covered tools, a cutting wire with additional slurry or a laser beam can be used for the structuring the surface. Depending on the tool that is used for the surface structuring, the regions adjacent to the flank-like regions can be rectangular-, U- or triangular-shaped (see FIG. 2). According to the invention, it is only of special importance that the flank-like region (4) is formed sufficiently wide and parallel (or nearly parallel) to the substrate normal. Normally, the width of the flank-like regions is between 5 and 50 microns depending on the distance between the contact fingers. Hereby, structures which require only a small removal of silicon are of advantage, as the costs of the surface structuring are primarily depending on the amount of Silicon to be removed. If in addition to the structure necessary for the contact formation, a secondary considerably smaller structure (8) for improved light trapping is to be produced, this can be applied by mechanical or chemical processes after the formation of the coarse structure for the contact formation.

The structure (9) shown in FIG. 3b is saw-tooth shaped and among others aims serves the improvement of the minority carrier collection properties, as the light hitting the left flank is reflected into the semiconductor substrate (2). The shift of the collecting pn junction can extend from about 10 μm up to 150 μm. The two functions of the structure concerning the optical and the electrical properties are especially suited for semiconductor materials having small diffusion lengths which cannot be textured chemically, like e.g. multi crystalline or EFG material. Other forms of depressions for improving the collection probability of minority carriers (rectangular-, u- , v-shaped etc.) can also be used.

The formation of the pn junction on the front side of the solar cell can also be performed by spin-on of a solution containing dopants instead of deposition from the gas phase. In addition, the formation of the diffusion barrier on the back side of the cell can be omitted, if in a following step the diffusion of the back side is compensated by secondary applied atoms, e.g. formation of an aluminium back surface field. The generation of the pn junction (11) can also be carried out by application of fixed charges (Cs-ions and silicon nitride) and the resulting inversion of the semiconductor surface.

According to the invention, two possibilities of fixing the width k of the electrical conducting contacts (5) when forming the front contacts on the flank-like regions by physical shallow angle vacuum evaporation shall be emphasised (FIG. 4). First, the width k of the contact finger is determined by the evaporation angle α and the distance a of the edge of the shadow from the flank-like region to be covered with metal. It is: $\tan \alpha < b/a$ and $k = a \cdot \tan \alpha$, where b is the width of the flank-like region. In contrast, using the second way, the contact width is only defined by the width b of the flank-like region. In this case, $\tan \alpha \geq b/a$ and $k = b$. This application of the invented process is of advantage if in an industrially scaled process the alignment of the evaporation angle shall be dispensed. The adjustment of the width b of the flank-like regions is much more easier. In addition, the contact width k is independent of limitations (e.g. small distance a and small divergence of the evaporation beam) for a sharp-edged shadow due to tie edges of the surface structure.

Another advantageous possibility of the invention includes coating the semiconductor surface (2) with a passivation layer (7) prior to applying the contacts, to open the passivation layer in the small regions where the contacts are to be applied, and after that applying broad metal contacts (5) in a way that the contacts are running along the opened semiconductor surface as well as—at least partially—along the passivated surface (see FIG. 1b). Hereby, the area of the metal-semiconductor-contact can be drastically reduced, leading to lower charge carrier recombination and hence to an advantageous increase of the open circuit voltage and hence increases the cell efficiency. In contrast to the metal contact running along the plateaus as described in EP 0548863, the invented electrical conductive contacts run along the flank like regions (4), which are parallel or nearly parallel to the substrate normal. From this an obvious reduction of shading due to the opaque metal fingers is achieved and a higher efficiency can be reached.

The invented process can also be used for the production of the back contacts of solar cells. Hereby, the process is carried out in the same manner as for the fabrication of the front contacts. Preferably, the back side contacts run perpendicular to the front side contacts to avoid possible series resistance losses. The prime proposal characterising the invention—to apply the contact lines self aligned to the flank like regions running parallel or nearly parallel to the substrate normal—is also advantageous for the back side contact of the solar cell. On one hand, the process offers the possibility of producing bifacial solar cells in a simple way, as in contrast to common solar cells only a fraction of the total back surface area is covered with metal. On the other hand, for the back surface all the advantages described for the front side apply also.

From FIG. 1d, once again the preferred implementation of the solar cell according to the invention can be seen. The height of the flank like region (4), that runs perpendicular or nearly perpendicular to the plane defined by the solar cell surface, is referred to as "b". The plateau region (20) adjacent to the corresponding flank region (4) running in the plane of the substrate surface has the width h. From the plateau region (20) a plane (24) runs to the bottom edge (22) of the flank like region (4). The edge SK formed by the transition of the planes (20, 22) is a so-called shadow-generating edge, which depending on the evaporation angle dictates the height of the area on which the electrical conductive material for the electrical contact formation is deposited. The corresponding height is referred to as "k".

In the projection on the plane defined by the surface of the solar cell, the width of the plateau like region (20) is "h" and the width of the area (24) running at an angle to this is "a", where the width a of the area (24) is greater than the height b of the flank like region (4), particularly $a > 3b$.

The distance between subsequent following flank like regions (4) carrying electrical contacts (5) is A, where particularly the condition $100\,\mu m < A < 2000\,\mu m$ should apply. The height b of the flank like regions is preferably about $5\,\mu m < b < 200\,\mu m$.

Following FIG. 4 a special implementation of a solar cell according to the invention can be derived which is distinguished by the depressions following a rectangular shape. Therefore, each groove is restricted by two flank like regions (4, 26) running perpendicular to the plane defined by the solar cell surface (30) from which one carries the electrical conductive material. The corresponding flank-like regions (4) of the other implementation examples covered with the electrical conductive material are also of perpendicular orientation versus the plane defined by the semiconductor surface.

The first and second flanks (4, 26) which have the same or nearly the same height, are connected by the bottom plane (28) of the groove. Due to the shape of the flanks (4, 26) and the bottom side of the groove (28), the desired rectangular geometry of the groove is achieved.

What is claimed is:

1. A solar cell (1) comprising a semiconducting material in which incident radiation energy can generate charge carriers separatable by an electric field and conductible by first and second electrically conductive contacts (5), where on at least one surface of the semiconducting material (2) grooves separated by plateau regions are formed, with at least one flank region (4) and to which at least one flank region electrical conductive material, used for the formation of said first electric contact (5), is applied directly or indirectly, wherein said at least one flank region (4) is running perpendicular to the plane defined by said at least one surface of said semiconducting material and the electrical conductive material for the formation of said electrically conducting contacts is applied to said at least one flank region only.

2. Solar cell according to claim 1, wherein each of said grooves comprises a flank region (4) and a sloped section (24), said flank region including a top side and a bottom side, said plateau region (20) extending from the top side of the flank region of a first grooves (4), to the sloped section of a second grooves (24) where the sloped section of said second grooves meets the flank region of said second grooves at an angle γ of at least 60°≦γ≦75°.

3. Solar cell according claim 2 wherein at least one of said plateau regions 20 has a width h and the groove adjacent to said at least one plateau region has a width a, wherein h>2 μm, particularly 5000 μm>h>2 μm, and/or said flank region (4) has a height b with b<a, and particularly a>3b.

4. Solar cell according to claim 3 wherein said first electrically conducting contact (5) extends along the entire length or nearly entire length of said flank region (4) and the electrically conducting material for the formation of said electric conductive contacts (5) has a height k, approximately equal to the height b of said flank regions (4).

5. Solar cell in accordance with claim 3 wherein said grooves have a U-, circle segment or triangular shaped cross section and wherein the non-flank region of said semiconducting material includes formed structures (8) having a height substantially smaller than height b.

6. Solar cell in accordance with claim 1, claims wherein said solar cell shows said flank areas (4) to which the electrical conductive material is applied at the front and/or the back surface.

7. Solar cell in accordance with claim 1, wherein subsequent parallel or nearly parallel running flank regions (4) to which the electrical conductive material is applied have a distance A of 30 μm<A<5000 μm, particularly 100 μm<A<2000 μm and/or the height b of said flank regions (4) amounts to 5 μ<b<200 μm.

8. Solar cell in accordance with claim 1 including a passivation layer adjacent to the electrical conductive material.

9. Solar cell according to claim 1, wherein each of said grooves comprises a first flank region (4), and a second flank region (26), each of said first and second flank regions including a top side and a bottom side, wherein one of said plateau regions (20) extends from the top side of the first flank region of a first grooves, to the second flank region of a second grooves.

10. A solar cell (1) comprising of a semiconducting material in which incident radiation energy can generate charge carriers separatable by an electric field and conductible by first and second electrically conductive contacts (5), where on at least one surface of the semiconducting material (2) grooves are formed, with at least one flank region (4) having a height b and to which at least one of said flank regions electrical conductive material, used for the formation of said first electric contact (5), is applied directly or indirectly, wherein said flank region (4) is running perpendicular to the plane defined by said at least one surface of the semiconducting material and the electrical conductive material for the formation of said electrically conducting contacts is applied to said flank regions only and wherein said grooves comprise said flank region (4) and a first bottom section and a second grooved bottom section, said flank region including a top side and a bottom side, said flank-like region (4) which at the bottom side is merging into said first bottom section (26) which is orientated parallel to the plane defined by the at least one surface of said semiconducting material, said first bottom section merging into said second bottom section (28), which is restricted from a second flank region (30) of the valley, wherein said grooved bottom section has a depth T and a v or triangular-like shaped cross section, and wherein said depth t is approximately equal to said height b.

11. A method for the fabrication of a solar cell comprising a semiconductor material in which due to the incident radiation energy charge carriers can be generated, which are separatable by an electric field and then conductible by first and second conductive contacts, where on one side of the semiconductor surface grooves seperated by plateau regions are formed, with first flank areas to which electrical conductive material for the formation of the electrical conductive contacts is applied indirectly or directly, wherein said flank areas are formed in such a way that they are orientated perpendicular to the plane defined by the semiconductor surface and said electrical conductive material is applied to said flank regions mask-free by shallow angle vacuum evaporation using the edge of said plateau regions as shadow masks, and wherein material deposited on regions of the semiconductor surface outside of said flank areas is removed selectively.

12. Method according to claim 11 wherein said electrical conductive material is deposited by the means of physical vacuum evaporation (PVD) with an angle α to the plane defined by the substrate surface with 90°>α>0°, preferable 30°>α>1°.

13. Method according to claim 11 wherein said electrical conductive material for the formation of a metal-insulator-contact (MIS-contact) is applied to the semiconductor surface on which a tunnel insulator layer has been applied first and wherein the semiconductor surface for the formation of depressions having said flank regions is structured by moving mechanical structuring elements, laser beam or etching methods.

14. Solar cell in accordance with claim 13 wherein said depressions are formed on the semiconductor surface by a deposition of semiconductor material onto a substrate.

15. A solar cell (1) comprising a semiconducting material in which incident radiation energy can generate charge carriers separatable by an electric field and conductible by first and second electrically conductive contacts (5), where on at least one surface of the semiconducting material (2) grooves separated by plateau regions are formed, the depth of said grooves being selected independently of said semiconducting material, said grooves having at least one flank region (4) to which electrical conductive material, used for the formation of said first electric contact (5), is applied, wherein said at least one flank region (4) is running perpendicular to the plane defined by said at least one surface of said semiconducting material and the electrical conductive material for the formation of said electrically conducting contacts is applied to said at least one flank region only.

16. The solar cell of claim 15 wherein the spacing between adjacent ones of said flank regions is selected independently of the depth of said grooves.

* * * * *